United States Patent [19]

Omori et al.

[11] Patent Number: 4,972,250
[45] Date of Patent: Nov. 20, 1990

[54] PROTECTIVE COATING USEFUL AS PASSIVATION LAYER FOR SEMICONDUCTOR DEVICES

[75] Inventors: Masahiro Omori, Palo Alto; Edward B. Stoneham, Los Altos, both of Calif.

[73] Assignee: Microwave Technology, Inc., Fremont, Calif.

[21] Appl. No.: 20,920

[22] Filed: Mar. 2, 1987

[51] Int. Cl.$^5$ .................. H01L 21/94; H01L 21/469; H01L 21/441
[52] U.S. Cl. ...................................... 357/54; 357/52; 357/2; 357/67
[58] Field of Search ...................... 357/52, 54, 67, 2, 4

[56] References Cited

U.S. PATENT DOCUMENTS

| | | | |
|---|---|---|---|
| 3,630,678 | 6/1968 | Gardner | 23/209.1 |
| 3,661,526 | 6/1969 | Angus et al. | 23/209.1 |
| 4,028,149 | 6/1977 | Deines et al. | 148/175 |
| 4,254,426 | 3/1981 | Pankove | 357/2 |
| 4,420,765 | 12/1983 | Tarng | 357/52 |
| 4,436,766 | 3/1984 | Williams | 427/96 |
| 4,722,913 | 2/1988 | Miller | 437/196 |
| 4,767,608 | 8/1988 | Matsumoto et al. | 423/446 |

FOREIGN PATENT DOCUMENTS

| | | | |
|---|---|---|---|
| 2944937 | 6/1981 | Fed. Rep. of Germany | 357/52 |
| 58-145134 | 8/1983 | Japan | 357/52 |
| 60-208852 | 10/1985 | Japan | 357/52 |
| 61-6198 | 1/1986 | Japan | 357/52 |

OTHER PUBLICATIONS

J. Szmidt et al., "Basic Properties of Metals of Metal-/Insulator/Semiconductor Structures Containing Borazone and Diamond Layers Produced by the Reactive Pulse Plasma Method", *Thin Solid Films* 110, pp. 7–20, 1983.
M. P. Callaghan et al., "A New System for the Chemical Vapour Deposition of SiC", Journal of Crystal Growth 13/14, pp. 397–401, 1972.
Haś et al., Thin Solid Films, 136, pp. 161–166, Feb. 15, 1986.
Vik J. Kapoor et al., "Diamondlike Carbon Films on Semiconductors for Insulated-Gate Technology", J. Vac. Sci. Technol., A4(3), pp. 1013–1017, May/Jun. 1986.
Williams, Ralph E., "Gallium Arsenide Processing Techniques", Artech House, Inc., Deedham, MA, pp. 32–33, (1984).
"Advanced Materials", Fortune, pp. 34–36, Oct. 13, 1986.
"Diamond Process Improved", Electronic Engineering Times, p. 24, Oct. 26, 1987.
"Diamonds Shine Brightly in Aerospace's Future", Aerospace America, pp. 12–15 & 37, 11/87.
"Diamonds Find New Settings", High Technology, pp. 44–47, 4/87.
"New Era of Technology Seen in Diamond-Coating Process", The New York Times, Sep. 14, 1986.
"Is Diamond the New Wonder Material?", Science, vol. 234, pp. 1074–1076.
"U.S. Plays Catch-Up in Diamond Thin-Film Technology", Research & Development, pp. 41–42, Aug. 1987.
"Firms Rush to Commercialize Multifaceted Diamond Films", Wall Street Journal, Oct. 7, 1987.
"Big Profits in Theory—Can Crystallume Make Diamonds Sutter Hill's Best Friend?", Venture Strategies, pp. 80 & 82, 12/86.

(List continued on next page.)

*Primary Examiner*—Rolf Hille
*Assistant Examiner*—S. V. Clark
*Attorney, Agent, or Firm*—Skjerven, Morrill, MacPherson, Franklin & Friel

[57] ABSTRACT

A protective coating useful as a passivation layer for semiconductor devices incorporates a thin film of an amorphous diamond-like carbon. In one implementation, a thin film of amorphous silicon is deposited over the carbon material. The semiconductive passivation coating eliminates electrical shorts, dissipates charge build-up and protects against chemical contamination.

16 Claims, 1 Drawing Sheet

OTHER PUBLICATIONS

"Research Proposal on Diamond and Diamondlike Carbon Coatings", Battelle, 10/86.

"The Key to Making More Powerful Chips", Business Week, Science & Technology, pp. 136F–136G, May 11, 1987.

"Depositing Synthetic Diamond on a Thin Film", Chemical Week, p. 69, May 7, 1986.

"Diamond–Hard Coatings", Industry Week, p. 83, 11/16/87.

"New Era of Technology Seen in Diamond-Coating Process", The New York Times, 9/14/86.

Suwa Seikosha K.K., *Patent Abstracts of Japan*, vol. 7, No. 258, (E-211)[1403], Nov. 17, 1983, The Abstract of JP-A 58 145 134 entitled "Semiconductor Device".

S. Berg and L. P. Andersson, *Thin Solid Films*, vol. 58, 1979, pp. 117–120, Elsevier Sequoia S.A., Laussane, entitled "Diamond-Like Carbon Films Produced in a Butane Plasma".

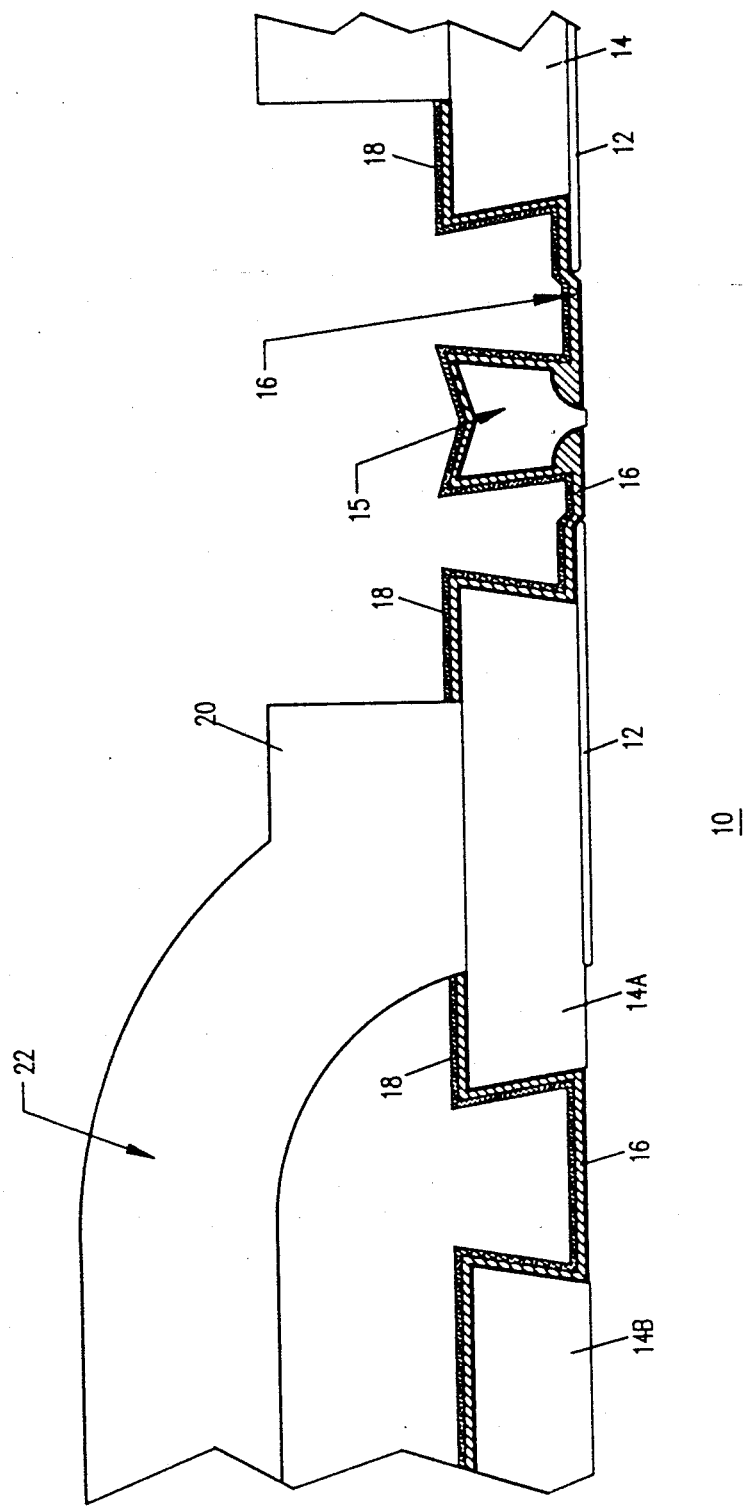

PROTECTIVE COATING USEFUL AS PASSIVATION LAYER FOR SEMICONDUCTOR DEVICES

BACKGROUND OF THE INVENTION

1. Field of the Invention

This invention relates generally to a protective coating for electrical devices and in particular to a thin film assembly useful as a passivating coating for a semiconductor device.

2. Description of the Prior Art

In present day semiconductor technology, passivation layers are used to provide several functions for protection of the semiconductor device structure against environmental influences that arise in the manufacture and application of semiconductor devices. Passivation layers protect the semiconductor devices from the effects of moisture and contaminants which may occur during oxidation or other steps of the manufacturing process such as during assembly of circuits using the devices, or during the practical operation of the devices in circuit environments. By using passivation layers, production yield is increased and deleterious effects are minimized when the semiconductor device is operating in the field.

Especially desirable are passivation layers that effectively passivate surface states, which are electron energy levels at the surface of the semiconductor substrate, characterized by electrical charge and discharge having variable time constants. This phenomenon causes electrical drift, which may be short term or long term and which undesirably changes the characteristics of a field effect transistor. Surface states are "passivated" when a layer overlying the semiconductor surface interacts with atoms at the surface in such a way as to reduce the time constants characterizing the electrical charge and discharge of the surface states to values small enough to eliminate electrical drift problems. Surface states on a silicon crystal can be passivated by a silicon dioxide layer produced by thermal oxidation, for example. Surface states on gallium arsenide can be passivated by a layer of semiconducting material other than gallium arsenide, for example, providing the interface between the gallium arsenide surface and the semiconducting layer is appropriately controlled. The resulting junction between the semiconductor surface and the semiconducting layer is called a "heterojunction".

Passivation layers act as insulators and protect against electrical shorting and low breakdown voltages. Passivation layers also act as potting materials that protect against surface scratches and thus prevent electrical shorting.

During some processes of semiconductor device handling vacuum wands or other tools are used to move wafers or chips from one position to another. In such cases, the tool may cause a displacement or abrasion of exposed metal conductors that are formed on the wafers. Passivation layers help to eliminate this problem. Another problem that is encountered is found with semiconductor devices that incorporate an air bridge, which is a metal connection to a metal conductor that skips over an adjacent conductor, so that capacitive coupling is not added between the two conductors. The air disposed between the air bridge and the skipped over conductor has a low dielectric constant of nearly unity. However, if the metal air bridge is subjected to mechanical pressure causing it to contact the skipped over metal conductor, an electrical short would result. A passivation layer overlying the skipped over metal conductor can act as an electrical insulator to insure against such shorting.

Passivation layers generally are composed of silicon dioxide or silicon nitride, for example. Passivation layers using such materials are usually relatively thick, about 2000Å or more, and require long deposition time, which adds to the cost of the semiconductor devices. With dielectric constants more than three times that of air these thick layers increase the capacitances between various parts of a semiconductor device, thereby degrading the device's high-frequency performance. Also, silicon dioxide and silicon nitride do not adhere very well to gold which is used for electrodes or conductors and actually are known to separate from gold conductors so that circuit problems are caused. Thick layers of insulators or passivation material using silicon dioxide or silicon nitride are subject to strain, and as they are relatively brittle in nature, can experience cracking and do not seal well. Furthermore, insulators such as silicon dioxide or silicon nitride do little to passivate surface states on some semiconductors such as gallium arsenide and can themselves act as charge traps and produce drift problems.

SUMMARY OF THE INVENTION

An object of this invention is to provide a novel coating that is effective to protect electrical devices from electrical shorting and failure.

Another object of this invention is to provide passivation material for a semiconductor device that realizes an improvement in production and handling yields and enhances performance and reliability of the operating device.

Another object of this invention is to provide a semiconducting passivation material for a semiconductor device that partially passivates surface states and reduces drift problems in the operating device.

In accordance with this invention, a protective coating useful for a semiconductor device is formed with a carbon material that has diamond-like characteristics and is semiconducting. To obtain the desired carbon coating, a ring of graphite material is used as a target in a sputtering system to deposit a thin film of carbon to a specified thickness. The passivation layer covers exposed portions of the substrate, electrodes and metal conductors that are exposed. In one embodiment, a very thin film of amorphous silicon is deposited over the carbon layer. The silicon thin film protects the carbon from removal during plasma cleaning that occurs during the semiconductor manufacturing process and provides additional sealing and protection. In another implementation, wherein an air bridge connection to conductive elements on the substrate is formed, the passivation layer serves to insulate the conductive air bridge from adjacent exposed conductors where an electrical shorting problem could exist.

DESCRIPTION OF THE DRAWING

The invention will be described in greater detail with reference to the sole Figure of the drawing which is a representational view of a semiconductor device, partly cutaway, that incorporates the passivation coating of this invention.

The drawing depicts elements that are not in proper proportion or to scale but are enlarged for purpose of clarity and explanation.

DETAILED DESCRIPTION OF THE INVENTION

Although the description is directed to the use of a passivation material for a semiconductor device, it should be understood that the protective coating disclosed herein is also applicable to other electrical assemblies such as thin film circuits, microwave monolithic integrated circuits and for use as capacitor dielectrics, by way of example.

With reference to the drawing, a semiconductor device includes a substrate 10 which may be made of gallium arsenide or silicon by way of example. During the manufacture of the semiconductor device, an ohmic contact layer 12 is deposited on a wafer or substrate, followed by the deposition of a metallization layer 14 and the formation of a gate electrode 15. The metallization and gate may be formed of gold or another conductive metal, as is well known in the art. The wafer is then positioned in a vacuum chamber fitted with a Sloan Model S-310 sputtergun.

In accordance with this invention, a graphite ring target is placed in the sputtergun at a specified working distance of about 1.7 inches from the wafer. The sputtering system is operated at room temperature, and an argon environment at a pressure of about 8 microns is provided within the chamber enclosing the target and the wafer. A current of about 0.2 Amps DC is applied to the sputtergun so that the deposition rate of the carbon onto the wafer is about 50 Å/min. The sputtering deposition serves to deposit one atom at a time on the surface of the wafer so that a thin film, having a thickness in the range of approximately 100–20,000Å, and preferably of about 300Å, is deposited on the exposed surface portions of the wafer facing the target. The deposited carbon 16 is much harder than graphite and has diamond-like carbon characteristics. The carbon adheres well to the exposed areas of the substrate and to the metallization which is deposited on the substrate.

In one embodiment, a thin film of almost pure amorphous silicon 18 is deposited on the carbon layer by plasma enhanced chemical vapor deposition. The silicon deposition is accomplished at room temperature, using silane gas at a low pressure, which is 10 microns or less of mercury, by way of example. R.F. power excitation is applied so that a thin film of about 200–300Å of silicon is deposited over the carbon. The silicon conforms to the underlying carbon and effectively seals pin holes and protects the thin carbon material from removal during further processing. Additionally, the silicon film further protects the substrate surface from degrading effects.

After the deposition of the silicon, the semiconductor device is then processed to provide a third metallization layer 20 of gold that makes contact with the metallization layer 14 below the passivation material via through holes. The semiconductor structure is thus provided with conductive lines and bonding pads to enable electrical connection to external circuitry, in a well known manner.

In another implementation, the semiconductor device is fabricated with an air bridge 22, which may be made of gold, that leads from an electrode 14A to the electrode of an adjacent device structure (not shown). The air bridge in effect skips over the conductor 14B to make connection to the adjacent device. If pressure is inadvertently applied to the air bridge so that it is displaced towards the substrate surface, there is a chance that the air bridge will contact the metallic conductor 14B that normally is separated by air from the air bridge. By providing a passivation layer made of diamond-like carbon, or diamond-like carbon in combination with a silicon thin film, between the air bridge 22 and the opposing conductor 14B, the electrical shorting condition that would occur upon contact between the air bridge and the skipped over conductor 14B is prevented.

In an alternative implementation, the passivation assembly is formed with a sputtered carbon material covered by a second harder diamond-like carbon material deposited by plasma enhanced chemical vapor deposition. A silicon thin film can be deposited over the second layer of carbon.

It should be understood that the invention is not limited to the specific arrangements and parameters set forth above. For example, the passivation material may be amorphous carbon, diamond-like carbon, polycrystalline diamond and/or monocrystalline diamond. The passivation material may be deposited over a third metallization layer of the semiconductor device. The semiconductor device may be bipolar as well as a field effect transistor. The magnitudes of the current, temperature, pressure, the working distance between the target and wafer, and the chemical makeup of the gas may be varied within the scope of this invention. Also, methods other than sputter deposition or plasma enhanced chemical vapor deposition may be employed to create the carbon or silicon layers.

The passivation structure affords a very thin film that increases interelectrode capacitances very little and lends itself to enhanced integrated circuit performance. This is in contrast to the thick passivation layers used in prior art devices that tend to degrade performance significantly, as much as 0.5–1 dB in high-frequency gain, for instance. Also, even though the passivation film is relatively thin, it still provides sufficient protection against chemical penetration. The semiconductive passivation material having diamond-like carbon characteristics dissipates charge build-up very quickly so that drift problems are minimized. The diamond-like carbon, being itself a semiconductor, can form a heterojunction with the semiconductor surface and thereby partially passivate the surface states.

What is claimed is:

1. Structure comprising:
   a support on which a number of electrically conductive elements are formed;
   passivation material covering portions of said support and said conductive elements wherein said passivation material comprises sputtered carbon; and
   a layer of one of diamond-like carbon, polycrystalline diamond, and monocrystalline diamond formed by plasma enhanced chemical vapor deposition over said sputtered carbon.

2. Structure as in claim 1, further including a silicon thin film deposited over said diamond or diamond-like carbon.

3. Structure as in claim 2, wherein the thickness of said silicon is in the range of about 200–300Å.

4. Structure as in claim 1, wherein the thickness of said passivation material and said layer is in the range of about 100–2000Å.

5. Structure is in claim 1, wherein said passivation material is formed from a carbon material by sputter deposition.

6. Structure as in claim 1, wherein said support comprises a semiconductive material that acts as a substrate for a semiconductor device.

7. Structure as in claim 6, including metallization layers formed above a surface of said substrate to provide electrical connections between regions formed in said substrate.

8. Structure as in claim 7, including an air bridge comprising a metal connection that is connected to a metal conductor formed with said semiconductor device, such that said metal connection overlies but does not contact another metal conductor formed with said semiconductor device.

9. An assembly comprising:
a semiconductor substrate;
a metallization layer comprising electrically conductive elements;
passivation material comprising sputtered carbon covering portions of the surface of said substrate and said conductive elements; and
a layer of one of diamond-like carbon, polycrystalline diamond, and monocrystalline diamond formed by plasma enhanced chemical vapor deposition disposed over said sputtered carbon.

10. An assembly as in claim 9, further including a silicon thin film deposited over said layer of diamond or diamond-like carbon.

11. An assembly comprising:
a semiconductor substrate;
a metallization layer comprising electrically conductive elements;
a conductive air bridge connected to selected ones of said conductive elements and bridging over a conductive element between said selected connected elements; and
passivation material disposed between said air bridge and said bridged over conductive element, said material consisting essentially of one of amorphous carbon, diamond-like carbon, polycrystalline diamond and monocrystalline diamond.

12. Structure comprising:
a support having a number of electrically conductive elements;
passivation material covering portions of said support and said conductive elements wherein said passivation material comprises sputtered carbon; and
a layer of one of diamond-like carbon, polycrystalline diamond, and monocrystalline diamond formed over said sputtered carbon.

13. A semiconductor device comprising:
a substrate formed from a semiconductor material consisting essentially of gallium arsenide, said substrate having a number of electrically conductive elements; and
passivation material disposed over at least portions of said substrate and said conductive elements, said passivation material consisting essentially of one of amorphous carbon, diamond-like carbon, polycrystalline diamond and monocrystalline diamond.

14. A semiconductor device as in claim 13 wherein said passivation material is formed as a single layer.

15. A semiconductor device comprising:
a substrate formed from a semiconductor compound consisting essentially of materials selected from Group III-V and Group II-VI, said substrate having electrically conductive elements; and
passivation material disposed over at least portions of said substrate and said conductive elements, said passivation material consisting essentially of one of amorphous carbon, diamond-like carbon, polycrystalline diamond and monocrystalline diamond.

16. An assembly comprising:
a semiconductor substrate having a surface;
an insulation layer formed on at least part of said surface of said substrate;
electrically conductive elements formed on at least one of (i) said insulation layer and (ii) a portion of an exposed surface of said substrate;
passivation material consisting essentially of sputtered carbon covering portions of said surface of said substrate and said conductive element; and
a layer of diamond-like carbon, polycrystalline diamond or monocrystalline diamond formed by plasma enhanced chemical vapor deposition disposed over said sputtered carbon.

* * * * *